(12) United States Patent
Neema et al.

(10) Patent No.: US 8,265,918 B1
(45) Date of Patent: Sep. 11, 2012

(54) SIMULATION AND EMULATION OF A CIRCUIT DESIGN

(75) Inventors: Hem C. Neema, Sunnyvale, CA (US); Chi Bun Chan, San Jose, CA (US); Kumar Deepak, San Jose, CA (US); Nabeel Shirazi, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 72 days.

(21) Appl. No.: 12/579,846

(22) Filed: Oct. 15, 2009

(51) Int. Cl.
*G06F 17/50* (2006.01)

(52) U.S. Cl. .......................................... 703/14; 703/13
(58) Field of Classification Search .................... 703/14, 703/13, 23, 28
See application file for complete search history.

(56) References Cited

U.S. PATENT DOCUMENTS

| | | | | |
|---|---|---|---|---|
| 5,867,399 A | * | 2/1999 | Rostoker et al. | 716/102 |
| 6,332,201 B1 | * | 12/2001 | Chin et al. | 714/28 |
| 7,363,599 B1 | * | 4/2008 | Vogenthaler | 716/102 |
| 7,366,652 B2 | * | 4/2008 | Wang et al. | 703/28 |
| 2008/0184193 A1 | * | 7/2008 | Devins et al. | 717/104 |
| 2008/0263486 A1 | * | 10/2008 | Alexanian et al. | 716/5 |
| 2009/0150839 A1 | * | 6/2009 | Huang et al. | 716/5 |
| 2009/0287468 A1 | * | 11/2009 | Lin et al. | 703/28 |
| 2010/0241414 A1 | * | 9/2010 | Yeh et al. | 703/14 |

* cited by examiner

*Primary Examiner* — Saif Alhija
*Assistant Examiner* — Herng-Der Day
(74) *Attorney, Agent, or Firm* — LeRoy D. Maunu; Lois D. Cartier

(57) ABSTRACT

Co-simulation platforms generally include a software-based system and a hardware-based system in which different portions of the circuit design are either simulated in a software-based system or emulated on a hardware-based system. Before a model of circuit design can be co-simulated, the circuit design must be transformed and configured into a form that can execute and interface with a specific hardware-based system. The embodiments of the present invention provide a method, system, and article of manufacture for co-simulation of a portion of a circuit design and achieve an advance in the art by improving co-simulation configuration and setup and providing co-simulation adjustment capabilities during runtime.

18 Claims, 10 Drawing Sheets

SIMULATION AND EMULATION OF A CIRCUIT DESIGN

FIELD OF THE INVENTION

The present invention generally relates to the simulation and emulation of circuit designs.

BACKGROUND

During the process of developing a circuit design, the behavior of the design is simulated based on a specification of the circuit design. Simulating the design helps to verify correct behavior prior to physical implementation of the circuit. Wasted manufacturing costs due to faulty design may thereby be avoided. Numerous tools are available for simulating circuit designs including, for example, high-level modeling systems (HLMS) and hardware description language (HDL) simulators.

An HLMS is a software tool in which electronic designs can be described, simulated, and translated by machine into a design realization. In an HLMS-based design, there may be some components external to the HLMS environment that under certain circumstances, are desirable to have controlled by and involved in HLMS simulations. For example, it is sometimes useful to take existing HDL components that have been designed using a tool separate from the HLMS and incorporate the HDL components into an HLMS simulation environment. Furthermore, there may be existing hardware components that are desirable to involve in the HLMS simulation. The process of incorporating one or more external components into an HLMS-based simulation is referred to as HLMS co-simulation.

Example co-simulation platforms include both software-based and hardware-based systems. In a software-based system, for example, a portion of the design is simulated with software running on a workstation. In a hardware-based system, a portion of the design is emulated on a hardware platform that includes programmable logic circuitry such as that contained on a field programmable gate array (FPGA) or other types of programmable logic devices (PLDs).

In order to emulate a portion of a circuit design in hardware, the designer must configure the programmable logic circuitry to operate according to the desired portion of the circuit design and configure the simulation system to interface with the targeted programmable logic circuitry. This further may require the designer to modify the underlying hardware description language (HDL) code of the HLMS design. This may present a substantial barrier for a designer seeking to exploit the advantages of co-simulation during routine simulation and debugging.

SUMMARY

In some various embodiments of the present invention, a process is provided for the co-simulation of a portion of a circuit design. One or more module instances of a high level modeling system circuit design are selected to be both simulated within a software simulation environment and emulated on programmable logic circuitry. When prompted by the user, the module instances are compiled into respective simulation and emulation models. The programmable logic circuitry used for emulation is configured using the respective emulation models. The simulation environment is then configured for communication with the respective emulation models during simulation and emulation. The simulation and emulation models are then concurrently simulated and emulated, and results of the simulation and emulation are outputted to the user.

In some other various embodiments of the present invention, a system for the co-simulation of a portion of a circuit design is provided. The system includes programmable logic circuitry which is connected to a computing arrangement including a processor and memory. The computing arrangement is coupled to compile module instances of a high level modeling system circuit design into respective simulation and emulation models. The computing arrangement is further coupled to configure and operate the programmable logic circuitry in accordance with the emulation model. The computing arrangement is coupled to send and receive emulation data to and from the programmable logic circuitry, and to concurrently simulate module instances on the computing arrangement and emulate the module instances on the programmable logic circuitry. The computing arrangement is further coupled to output results from the simulation and emulation of the module instances.

In some various embodiments of the present invention, an article of manufacture is provided. The article is characterized by an electronically readable storage medium storing instructions for causing a processor to perform computing operations. The instructions cause the processor to select module instances of a circuit design for co-simulation within a software simulation environment and on programmable logic circuitry. Further instructions cause the processor to compile the module instances into respective simulation and emulation models in response to a first user command, and to configure the programmable logic circuitry using the respective emulation models. Further instructions are included to cause the processor to configure the simulation environment to communicate with the respective emulation model during simulation and emulation. The instructions further cause the processor to concurrently simulate and emulate the respective simulation and emulation models and output simulation and emulation results.

It will be appreciated that various other embodiments are set forth in the Detailed Description and Claims which follow.

DETAILED DESCRIPTION

Co-simulation refers to the simulation of different parts of a circuit design on different simulation platforms ("co-simulation platforms"). Generally, co-simulation platforms include a software-based system and a hardware-based system in which different portions of the circuit design are either simulated in a software-based system or emulated on a hardware-based system. Before a model of a circuit design can be simulated in a HLMS or emulated on hardware, the circuit design must be transformed into an executable form. When simulating in software, the circuit design is compiled into a program that is executable within a logic simulator. When emulating in hardware, the design is synthesized into a form that can be used to configure the target hardware to perform according to the portion of the design. When an FPGA is to be used as the target hardware, the design is typically synthesized into a logical network list (netlist) which can be implemented within a particular programmable logic device.

Before a circuit design can be synthesized into a netlist or compiled for simulation, the design must go through the preparatory processes of analysis and elaboration. In the analysis process, the HDL design is examined to determine if it contains syntax or semantic errors. If no errors are discovered, the analyzer creates an intermediate representation of each design module and stores it in a library.

In the elaboration process, the design is reduced to a collection of signals and processes. Each logic component is constructed and connections between logic components are established. This is generally done by parsing the design. For each instance of a design module encountered during parsing, a data structure is created for the instance and placed into a parse tree. Each instance data structure contains the processes of the module, variables used by those processes, and variables representing input and output signals from the module instance. Each module is then compiled or synthesized into an executable form.

The embodiments of the present invention provide a method, system, and article of manufacture for co-simulation of a portion of a circuit design and achieve an advance in the art by improving co-simulation configuration and setup and providing co-simulation adjustment capabilities during runtime.

Figure 1:
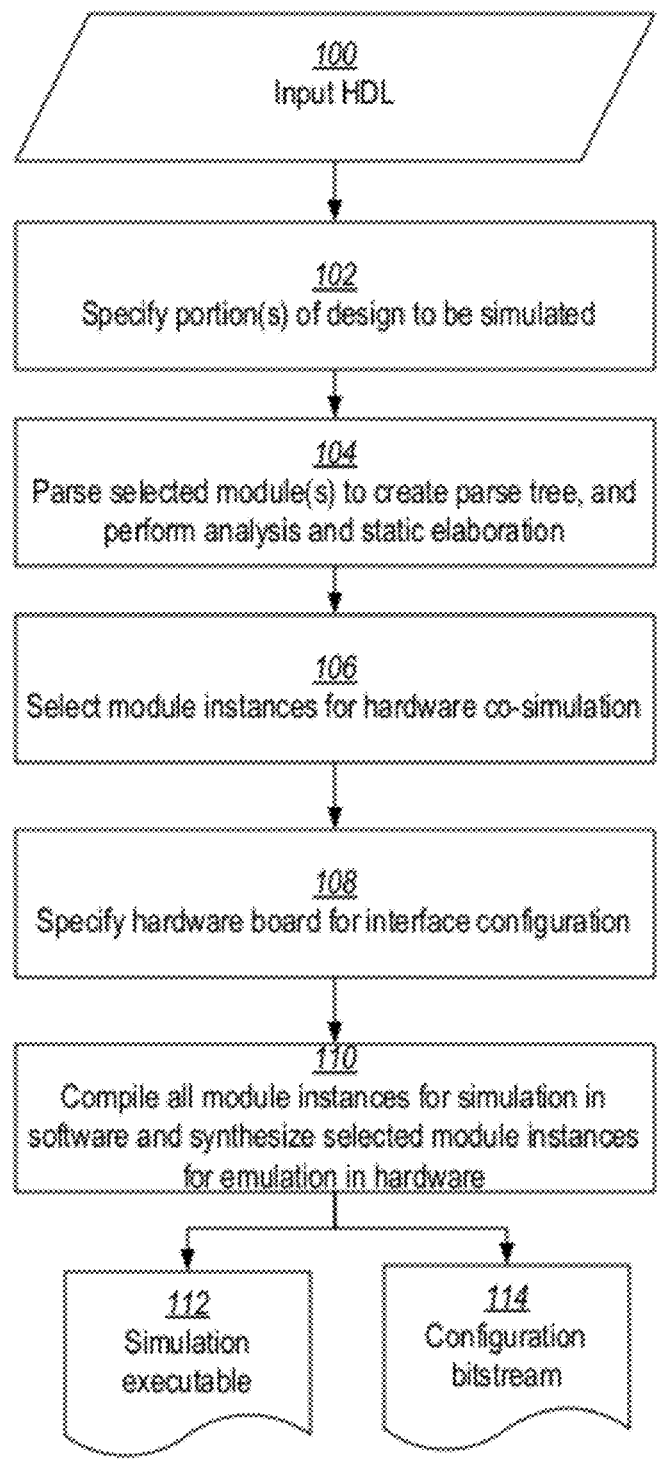
FIG. 1 illustrates a flowchart diagram of user selection and compilation of a module instance to be co-simulated on hardware.

FIG. 1 illustrates a flowchart of the selection and compilation of a module instance to be co-simulated in accordance with several embodiments of the invention. The circuit design is first loaded from an HDL file 100 from which the user selects the portion(s) of the circuit design to be simulated at step 102. The HDL code of the selected portion is parsed to create a parse tree on which analysis and elaboration is performed at step 104. From the hierarchy of the portion of the design selected at step 102, the user selects one or more instances of various modules of the design to be co-simulated in both hardware and software at step 106. The user then selects target hardware for the emulation of each module instance at step 108. At step 110, each module instance selected for co-simulation is compiled into an executable form for simulation in software and synthesized into a configuration bitstream 114, which can be used to configure specific hardware for emulating the selected module instances. Module instances not selected for co-simulation are compiled for simulation in software. The compiled instances selected for simulation, as well as the compiled instances selected for co-simulation, are combined to form a composite simulation executable 112.

Figure 2:
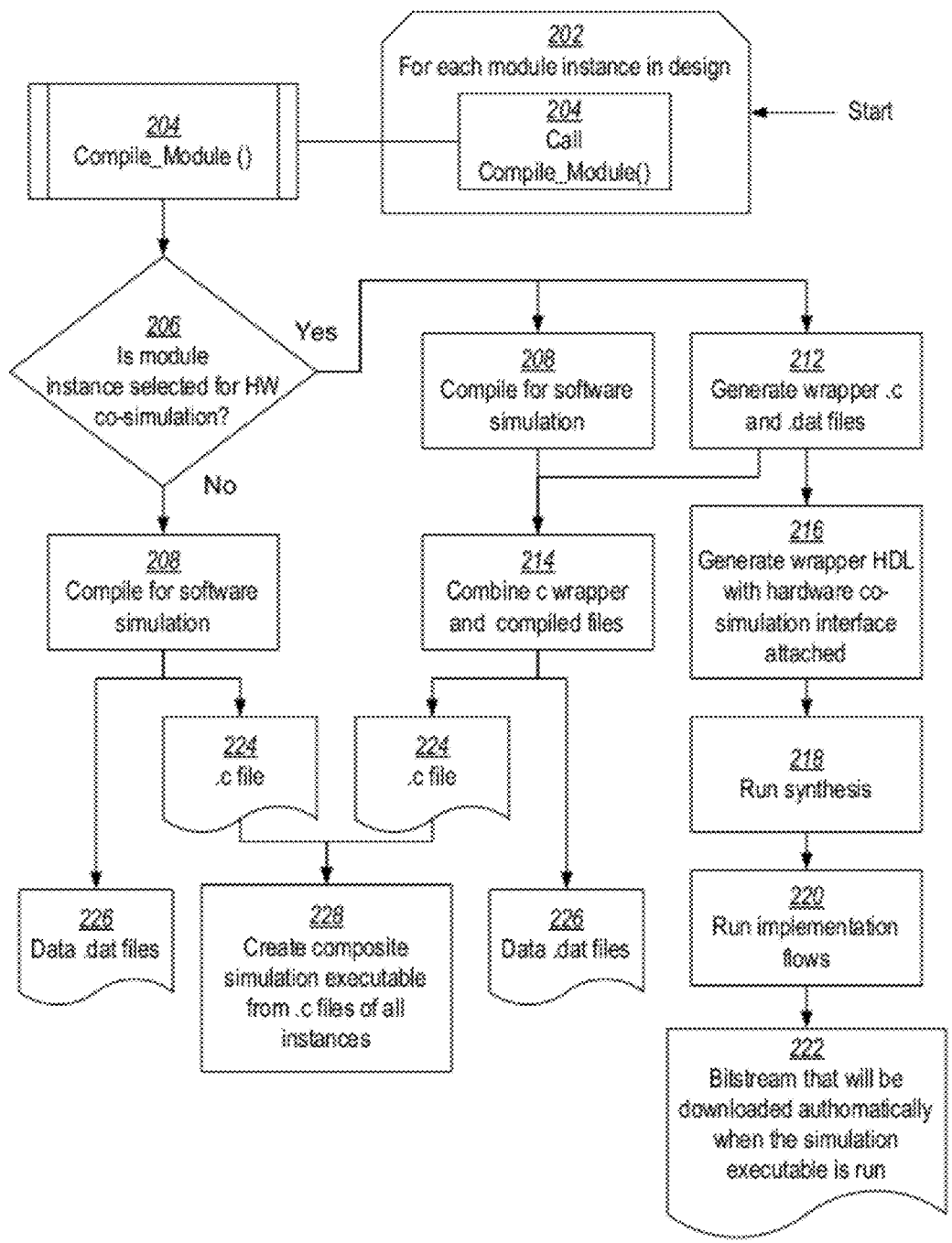
FIG. 2 illustrates a flowchart of the compilation process of each module instance.

FIG. 2 illustrates a flowchart diagram of the compilation process of each instance of a module, in accordance with several embodiments of the invention. Each module instance of the portion of the circuit design to be simulated is compiled individually at step 202 with an invocation of a Compile_Module() routine 204, for example. For each module, the compiler looks to see if the module instance has been selected for co-simulation at step 206. If the module instance is not selected for co-simulation, the instance is compiled at step 208 to generate executable code 224 and data files 226 needed for simulation.

If the instance is selected for co-simulation, the instance is compiled at step 208, and additionally, a modified instance-specific code wrapper is generated for communicating with the implemented module on the hardware on a per clock cycle basis at step 212. For example, if the module instance is selected to be co-simulated on hardware with a JTAG interface, .c and .dat wrapper files are created to format communication in compliance with the JTAG specification. The compiled code and data files of the co-simulation module are combined with the instance-specific code wrapper at step 214 to create composite code 224 and simulation data files 226 for the module instance that will be used to simulate the circuit in software and communicate with the emulation hardware. Code and simulation data files of all module instances to be simulated are combined to form the composite simulation executable at step 228. Some embodiments of the invention may refer to the composite simulation executable as the simulation model or co-simulation model, and such terms are used interchangeably herein.

To emulate the co-simulation module in hardware, the HDL code of the module instance is supplemented with HDL code to implement a JTAG component and other clocking circuitry necessary to coordinate JTAG communication to form a composite HDL wrapper of the module instance at step 216. The composite HDL wrapper is then synthesized into an emulation model, at step 218, and the emulation model is mapped and routed in a manner compatible with the target emulation hardware in the implementation flows at step 220. Following synthesis, bit stream configuration data to be loaded onto the target hardware and other instance specific data files are generated at step 222.

Figure 3:
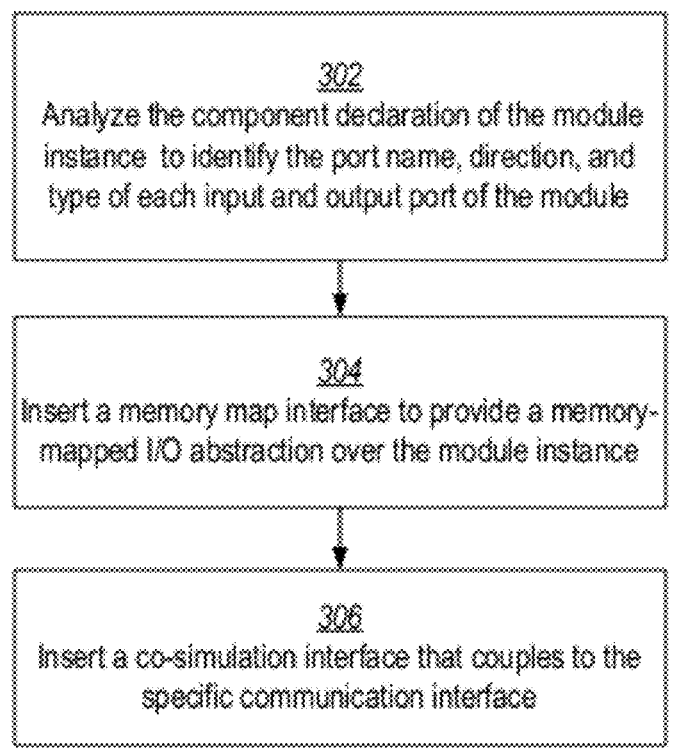
FIG. 3 illustrates a flowchart of HDL wrapper generation.

FIG. 3 illustrates a flowchart of a process for generating an HDL wrapper in accordance with several embodiments of the invention. The component declaration of the device under test is analyzed at step 302 to identify the port name, direction, and type of each input and output port of the co-simulated module instance. A memory map interface is inserted in the HDL code to provide a memory-mapped abstraction over the instance at step 304. In other words, writing data to or reading data from the module instance ports can be treated as memory write or read operations issued by the co-simulation interface. A co-simulation interface that couples to the specific communication interface, such as JTAG, is coupled between the host PC and FPGA board at step 306. The co-simulation interface also provides control signals to the memory map interface.

By automating this process, the need to use an HDL editor to modify the HDL code for emulation is eliminated. An HDL editor is understood to include any program used to manually add, delete, or modify the HDL code.

The code in Example 1 below illustrates an example skeleton of the HDL wrapper generated for a HDL design under test. The component declaration code of the design under test skeleton code is shown with four input/output ports. Memory map interface skeleton code is shown below the component declaration code. Co-simulation interface skeleton code is shown below the memory map interface.

```
U0: DUT
port map (
   in0=>in0,
   int=>int
   ...
   out0=>out0,
   out1=>out1,
   ...
);
—Memory Map Interface
U1: memory_map
port map (
   —Memory map control signals connected to cosim-
      _interface
   din=>memmap_din,
   dout=>memmap_dout,
   addr=>memmap_addr,
   we=>memmap_we,
   re=>memmap_re,
   —DUT port signals
   in0=>in0,
   in1=>in1,
   ...
   out0=>out0,
   out1=>out1,
   ...
);
—Co-simulation Interface
U1: cosim_interface
port map (
   —Memory map control signals
   memmap_din=>memmap_din,
   memmap_dout=>memmap_dout,
   memmap_addr=>memmap_addr,
   memmap_we=>memmap_we,
   memmap_re=>memmap_re,
   —Interface specific signals, e.g. JTAG TDO, TDI
   ...
);
```

Example 1

Figure 4:
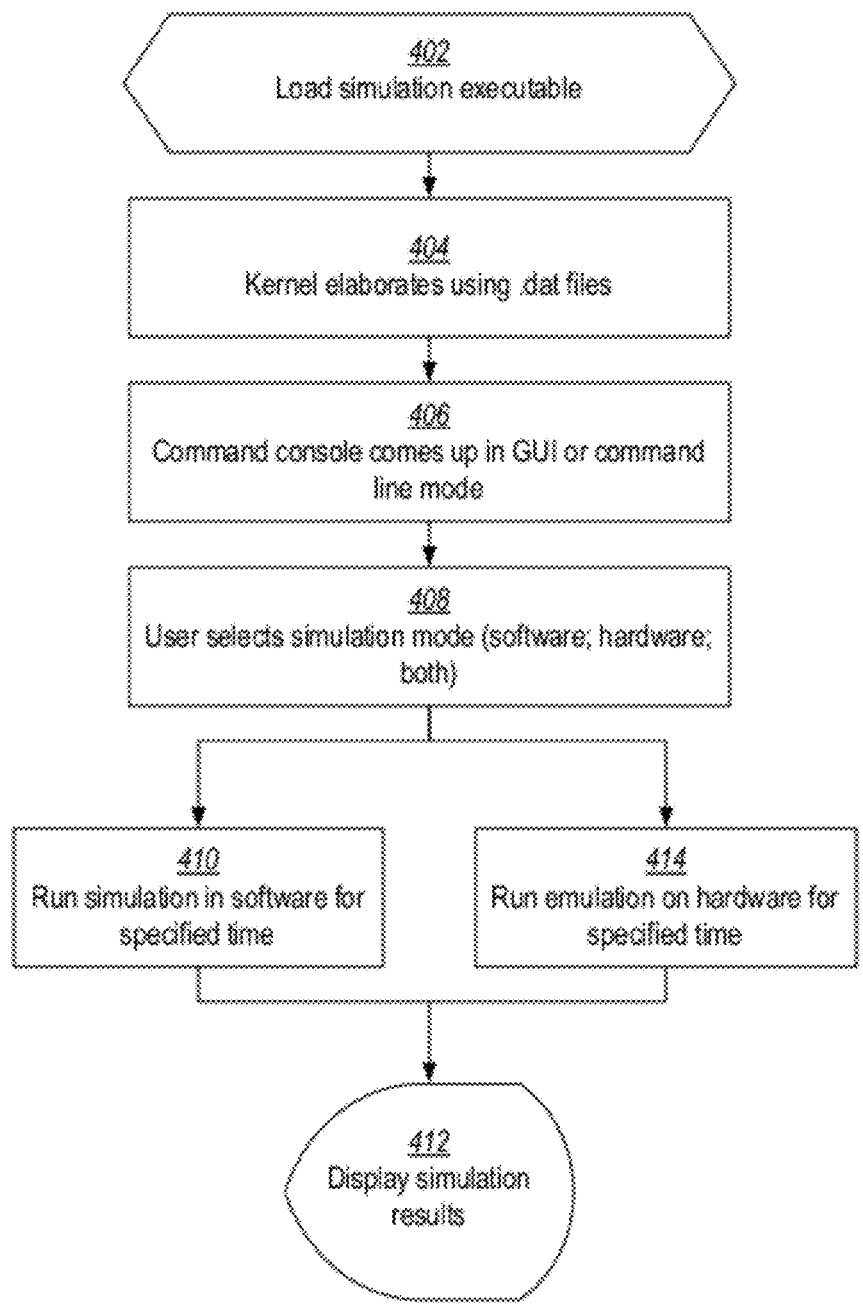
FIG. 4 illustrates a flowchart of simulation configuration and execution.

FIG. 4 illustrates a flowchart of a process for configuring a system for simulation and performing the simulation in accordance with several embodiments of the invention. The composite executable generated by the compilation shown in FIG. 2 is first loaded into memory at step 402. The composite executable is elaborated at step 404, using the data structures of the simulation environment kernel (not shown in figure) to construct the complete design hierarchy on the kernel side in terms of the kernel data structures. The kernel data structures contain the compiled processes of the module instances. At this point, the simulation is configured and ready to run.

Through a command console, e.g., a graphical user interface (GUI) or command line console, the user is prompted to select the manner in which the simulation result data is presented at step 406. The user can select to view software simulation results only, hardware emulation results only, or both in a compare mode as shown by step 408. The simulation and emulation models are then executed at steps 410 and 414 and results are displayed to the user at step 412 in the manner previously selected in step 408. In addition to or as an alternative to the displaying of results, the simulation and emulation results may be stored in computer main memory or in backup storage, or otherwise output by a suitably programmed computer.

Figure 5:
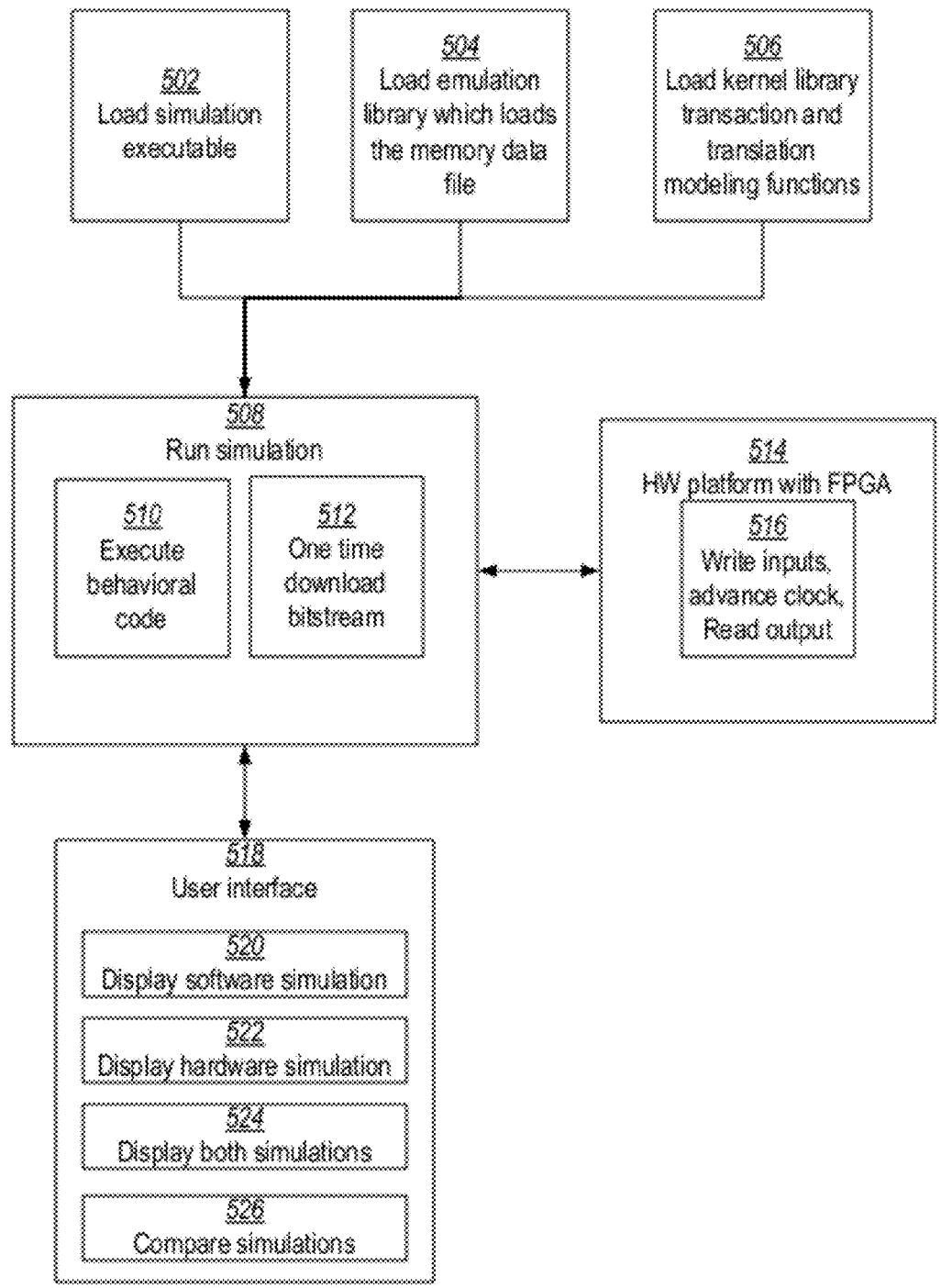
FIG. 5 illustrates a flowchart of simulation run-time operation.

FIG. 5 illustrates a more detailed flowchart of simulation run-time operation in accordance with various embodiments of the invention where, as an example, an FPGA configured with a JTAG port is used as the emulation hardware. When the user selects to start simulation, the simulation is configured as shown in FIG. 3. The simulation model is loaded into memory at step 502, along with the kernel library data files at step 506 and the emulation library, at step 504, which loads the memory data file of each module instance. The composite executable is then elaborated using the kernel data structures and memory map to construct behavioral code of the model (not shown).

The simulation is then executed at step 508. In running the simulation, a configuration bitstream is downloaded at step 512 to configure hardware platform 514, and behavioral code is executed at step 510. As the simulation runs, the emulation library communicates with the hardware co-simulation module instance (216 of FIG. 2) via a JTAG cable, through which the inputs (when they change) are provided to the design under test. Similarly, outputs from the design under test are read back through the same communication mechanism. A clock cycle advancement of a signal in the behavioral code 510 likewise causes the generated wrapper code to trigger a cycle of the clock for the hardware co-simulation module instance on board 516 via the JTAG interface. As a result of each clock advancement, data is retrieved from the hardware model for optional display or comparison.

Because co-simulated module instances are both simulated and emulated concurrently, the user may configure display mode settings in real time through user interface 518 without reconfiguring and recompiling the simulation and emulation models. While the simulation is running, the user can select to view only software simulation results with function 520, view only hardware emulation results with function 522, view both simulation and emulation results with function 524, or view both simulation and emulation results in a comparison mode with function 526. The display is then properly configured in response to the user settings.

If compare mode is selected, the waveforms of simulation results can be displayed in a waveform comparison mode. Additionally, any discrepancy between the two simulation/emulation results can be flagged with relevant debug information such as the time when the mismatch occurred, the HDL statement whose execution caused the mismatch, and the module instance that caused the discrepancy between the simulation and emulation models (not shown in FIG. 5).

Figure 6:
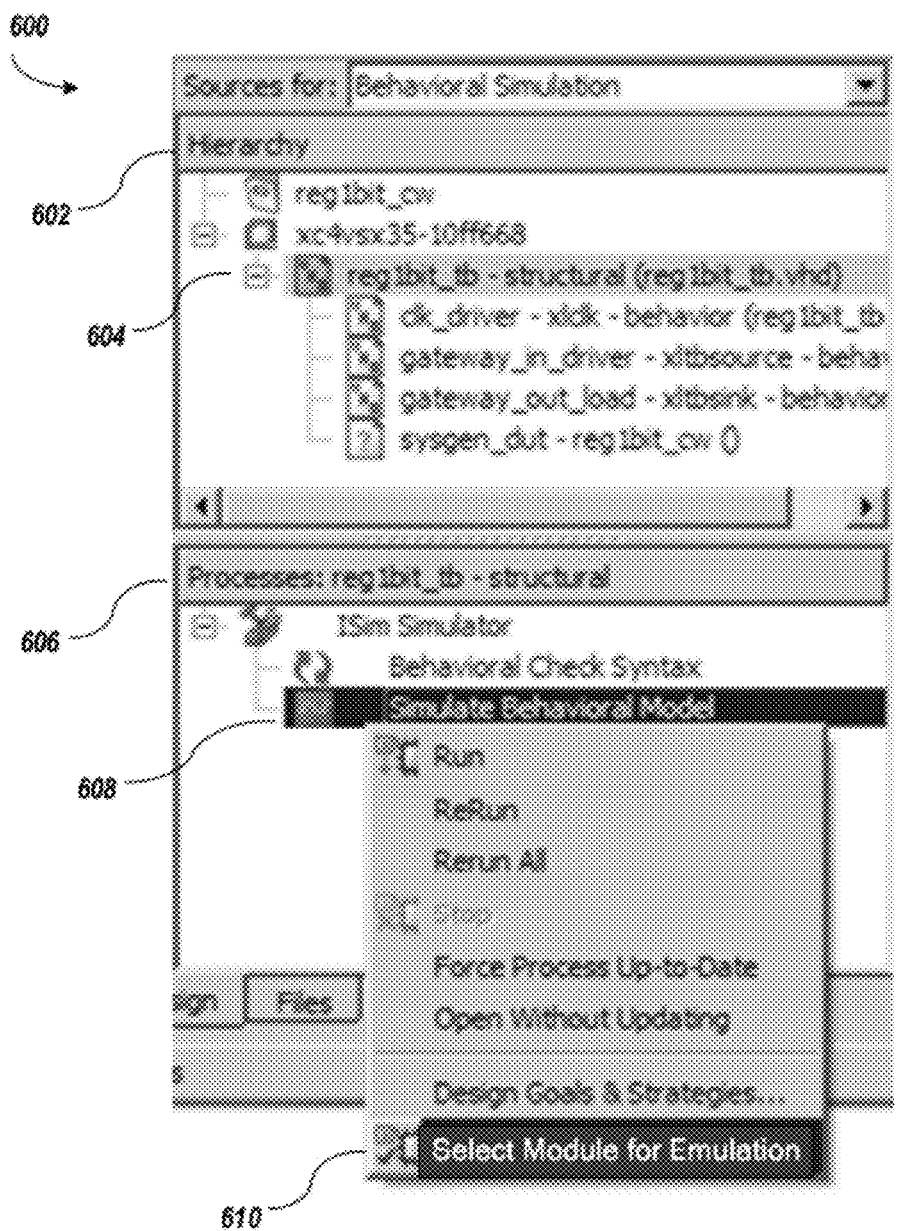
FIG. 6 illustrates, as an example, a graphical user interface for selecting module instances to be co-simulated.

FIG. 6 illustrates, as an example, a GUI for selecting module instances to be co-simulated in accordance with several embodiments of the invention. Main selection window 600 contains two sub-windows: 1) a hierarchy window 602 and 2) a control window 606. The hierarchy window 602 shows the hierarchy of the portion of the design that has been selected for simulation at step 102 of FIG. 1. The user can browse the hierarchy of the selected portion in the hierarchy window 602 and select a module instance from the hierarchy, such as 604. Information on the selected module instance 604 is shown in the control window 606. The user can select and adjust settings of several options including simulation settings listed in "Simulate Behavioral Model" 608. By right clicking on 608 a drop down selection window appears with an option to select the module instance for emulation 610. By selecting the instance for emulation, the instance will be co-simulated. If the module instance has already been selected for emulation the drop down menu will show an option to deselect the module instance for emulation (not shown).

The example GUI shown in FIG. 6 assumes that the user has already selected the portion(s) of the design to be simulated. In some embodiments of the invention, the user can select the portion(s) of the circuit to be simulated from the hierarchy window 602 (not shown). A drop down menu, similar to 610, is used to select the module instance as a portion to be simulated. After a module instance is selected for simulation, the user can select sub-module instances as described above for co-simulation. It is understood that any number of alternate selection tools may be utilized in the GUI to select simulation options such as: drop down menus, file menus, checkboxes, radial buttons, etc.

Figure 7:
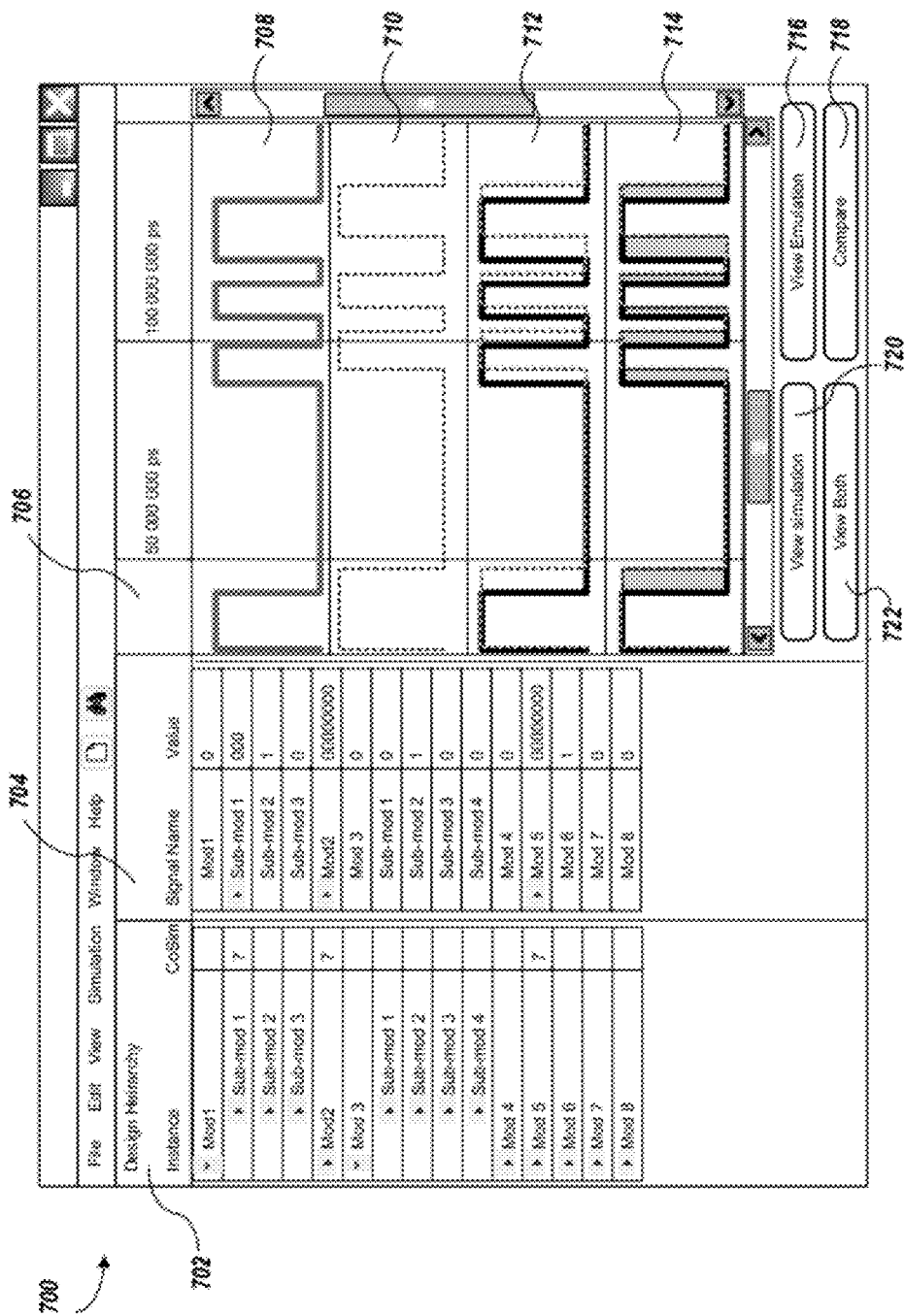
FIG. 7 illustrates, as an example, a graphical user interface for the control and display of module simulation.

FIG. 7 illustrates, as an example, a GUI for the control and display of simulation results in accordance with several embodiments of the invention. Main window 700 includes three sub-windows: 1) a design hierarchy selection window 702, 2) a signal output and control window 704, and 3) a waveform window 706. The design hierarchy selection window 702 allows the user to browse the design hierarchy and select the module instances to be co-simulated. To the right of each listed module instance in the hierarchy is a column showing whether the module instance has been selected for co-simulation.

The signal output and control window 704 displays the value of each signal generated and allows the user to select whether to display the signal as a waveform in the waveform window 706. The waveform window displays selected waveforms 708, 710, 712, and 714 as they are generated. The user can adjust the display of the waveform by highlighting the waveform (not shown) and selecting one of the display option buttons 716, 718, 720, and 722.

The four waveforms displayed illustrate the four display options for a waveform generated by a co-simulated module instance. In the waveforms displayed, simulation data is shown by solid lines and emulation data is shown by dotted lines. When a user selects view simulation 720, the waveform 708 showing only the simulation waveform is displayed. When a user selects view emulation 716, the waveform 710 showing only the emulation waveform is displayed. When a user selects view both 722, the waveform 712 showing the simulation and emulation waveforms is displayed. When a user selects compare 718, the waveform 712 showing both the simulation and emulation waveforms is displayed, with differences between simulation and emulation waveforms highlighted in waveform 714. The user can select and toggle between these views without stopping the simulation to adjust settings.

Figure 8:
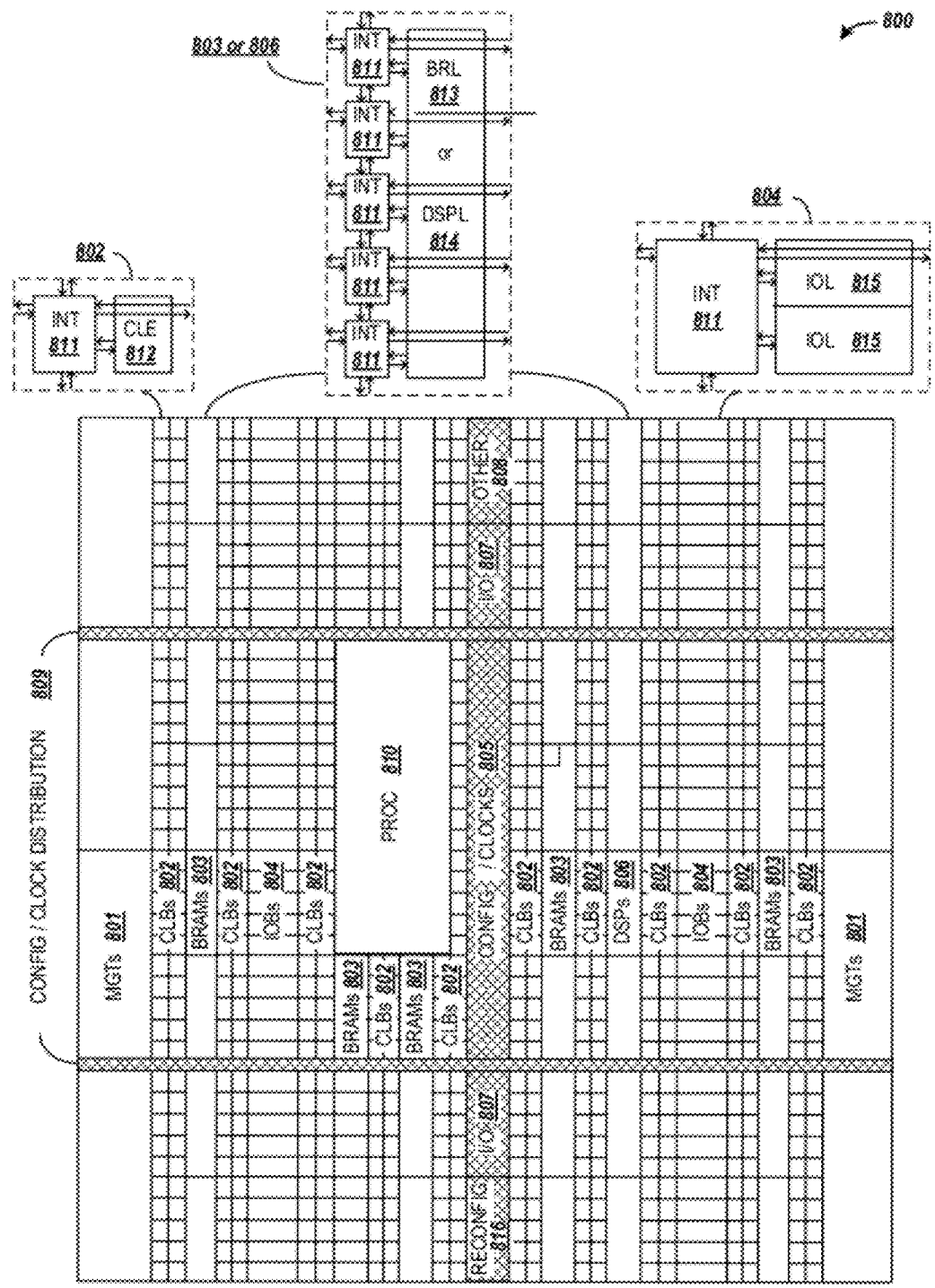
FIG. 8 illustrates a block diagram of a FPGA for implementing a system for co-simulation in accordance with various embodiments of the invention.

FIG. 8 is a block diagram of an example programmable integrated circuit that may be used for co-simulation of a circuit design in accordance with various embodiments of the invention. Emulation, as previously described, may be implemented on the programmable logic and interconnect resources of a programmable integrated circuit such as a field programmable gate array (FPGA), for example.

FPGAs can include several different types of programmable logic blocks in the array. For example, FIG. 8 illustrates an FPGA architecture (800) that includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), a reconfiguration port (RECONFIG 816), specialized input/output blocks (I/O 807), for example, e.g., clock ports, and other programmable logic 808 such as digital clock managers, analog-to-digital converters, system monitoring logic, and so forth. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic plus a single programmable interconnect element INT 811. A BRAM 803 can include a BRAM logic element (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 806 can include a DSP logic element (DSPL 814) in addition to an appropriate number of programmable interconnect elements. An IOB 804 can include, for example, two instances of an input/output logic element (IOL 815) in addition to one instance of the programmable interconnect element INT 811. As will be clear to those of skill in the art, the actual I/O pads connected, for example, to the I/O logic element 815 are manufactured using metal layered above the various illustrated logic blocks, and typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

Figure 9:
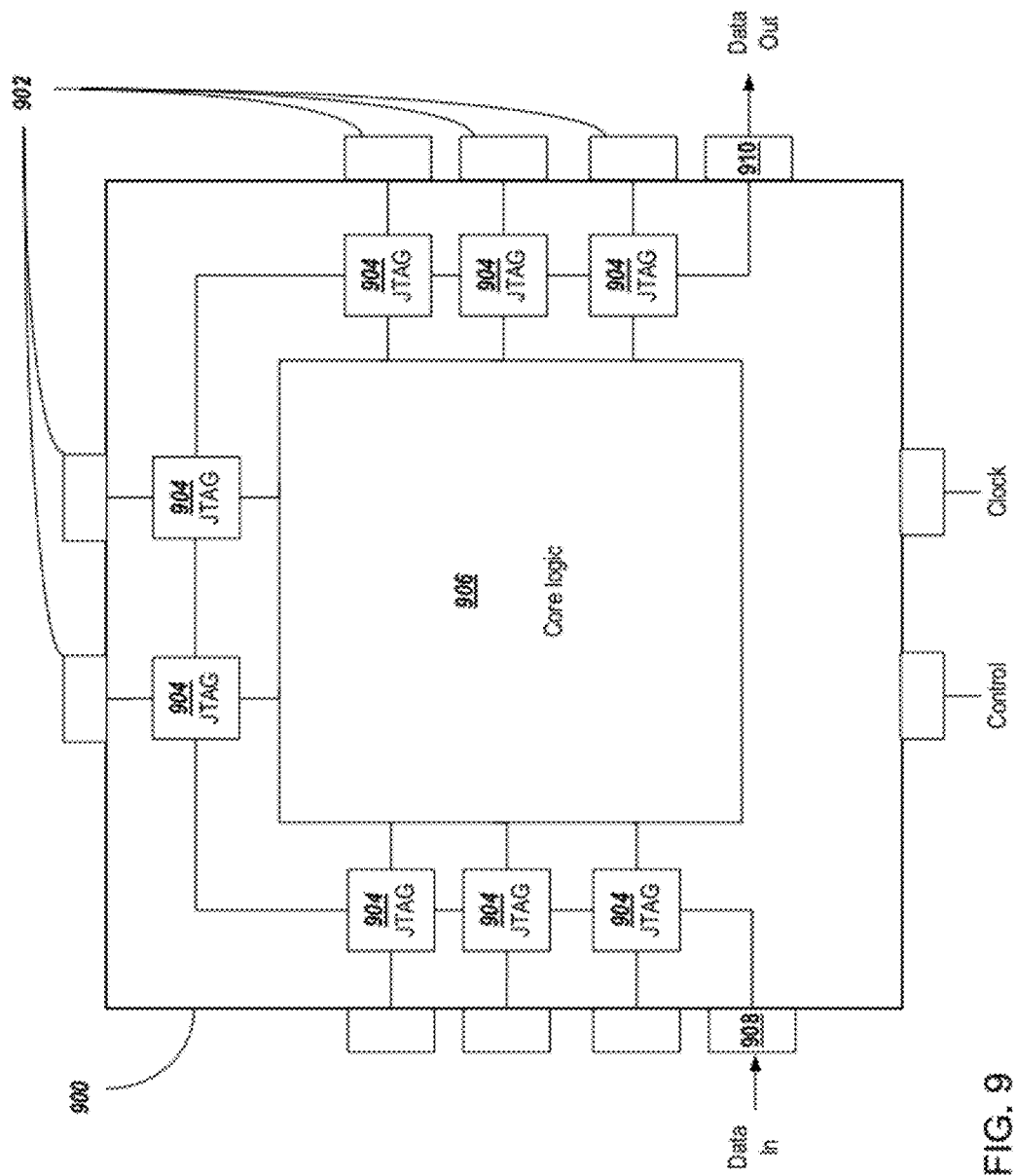
FIG. 9 illustrates a block diagram of a programmable logic device with JTAG.

FIG. 9 illustrates, as an example, a block diagram of a programmable logic device with JTAG capability. The programmable logic device 900 contains a core logic component 906, input output pins 902 with JTAG blocks 904 for each input output pin. The JTAG blocks can detect the value of the respective input/output pins as well as set the values that are received by the core logic device. Each JTAG block has an address and can send and receive data through JTAG serial data ports 908 and 910 according to the IEEE 1149.1 specification. Various embodiments of the invention utilize JTAG to send emulation input and receive emulation output to and from the device on a per clock cycle basis.

Figure 10:
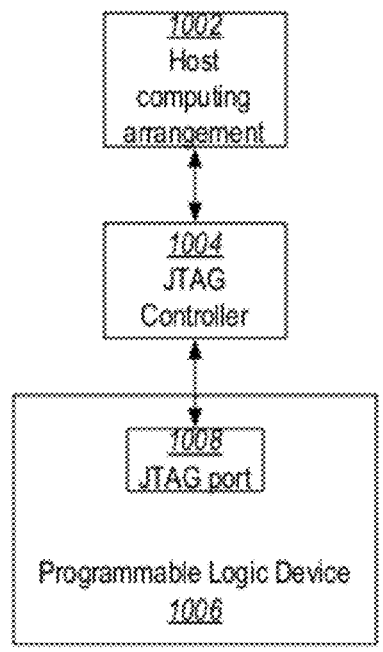
FIG. 10 illustrates a block diagram of a system for co-simulation of a circuit design which is adapted to implement IEEE 1149.1.

FIG. 10 illustrates a block diagram of a system for co-simulation of a circuit design adapted to implement JTAG, in accordance with various embodiments of the invention. A host computing arrangement 1002 is configured to host the simulation environment and perform the compilation/synthesis, configuration, simulation, and user interface processes. A programmable logic device 1006 configured with a JTAG port 1008 is used to implement the emulation of the circuit design. Communications between the host computing arrangement and the programmable logic device are controlled by a JTAG controller 1004. The JTAG controller communicates with the programmable logic device according to IEEE 1149.1 specifications and relays communications to the host computing arrangement.

Figure 11:
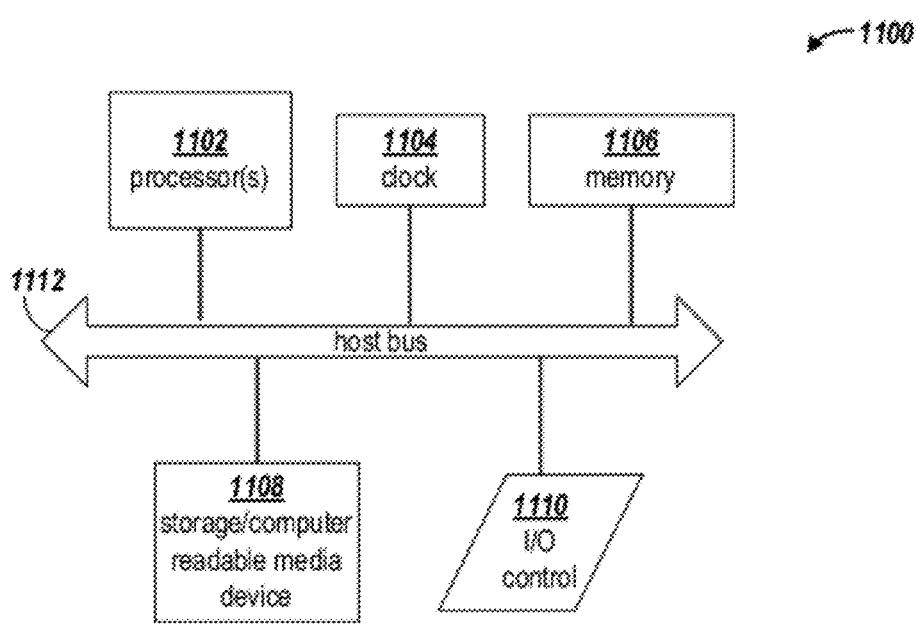
FIG. 11 illustrates a block diagram of a computing arrangement for implementing a system for hardware co-simulation in accordance with various embodiments of the invention.

FIG. 11 is a block diagram of an example of a host computing arrangement 1002 as referenced in FIG. 10. Those skilled in the art will appreciate that various alternative computing arrangements, including one or more processors and a memory arrangement configured with program code, would be suitable for hosting the processes and data structures and implementing the different embodiments of the present invention. The computer code, comprising the processes of the present invention encoded in a processor executable format, may be stored and provided via a variety of computer-readable storage media or delivery channels such as magnetic or optical disks or tapes, electronic storage devices, or as application services over a network.

Processor computing arrangement 1100 includes one or more processors 1102, a clock signal generator 1104, a memory unit 1106, a storage unit 1108, and an input/output control unit 1110 coupled to host bus 1112. The arrangement 1100 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements, as would be recognized by those skilled in the art. The processor 1102 may be one or more general purpose processors, or a combination of one or more general purpose processors and suitable co-processors, or one or more specialized processors (e.g., RISC, CISC, pipelined, etc.).

The memory arrangement 1106 typically includes multiple levels of cache memory and a main memory. The storage arrangement 1108 may include local and/or remote persistent storage such as provided by magnetic disks (not shown), flash, EPROM, or other non-volatile data storage. The storage unit may be read or read/write capable. Further, the memory 1106 and storage 1108 may be combined in a single arrangement.

The processor arrangement 1102 executes the software in memory 1106 and/or storage 1108 arrangements, reads data from and stores data to the memory 1106 and/or storage 1108 arrangements, and communicates with external devices through the input/output control arrangement 1110. These functions are synchronized by the clock signal generator 1104. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures of the different embodiments of the present invention.

The present invention is thought to be applicable to a variety of systems for the simulation and emulation of a circuit design. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of co-simulation of a portion of a circuit design, comprising:
    selecting one or more module instances from a plurality of module instances of a high level modeling system circuit design to be both simulated within a software simulation environment and emulated on programmable logic circuitry;
    in response to a first user command, compiling each of the one or more module instances into both a respective simulation model and a respective emulation model;
    configuring the programmable logic circuitry using each respective emulation model;
    configuring the simulation environment for communication with each respective emulation model during simulation and emulation;
    for each module instance of the one or more module instances, concurrently simulating and emulating the respective simulation model and respective emulation model of the module instance;
    comparing results from the simulation of the simulation model with results of emulation of the emulation model;
    in response to a discrepancy between the compared results, storing discrepancy data indicating a time and module instance in which the discrepancy occurred; and
    outputting results from the simulation and emulation of each respective simulation model and each respective emulation model,
    wherein the compiling of each of the one or more module instances into both a respective simulation model and a respective emulation model includes:
        identifying a port name, direction, and type of each input and output port of each of the one or more module instances; and
        generating for each of the one or more module instances, in response to the identified port name, direction, and type of each input and output port, a memory map for accessing the respective emulation model.

2. The method of claim 1, further comprising:
    displaying results of the simulation of one module instance of the one or more module instances in response to a second user command;
    displaying results of the emulation of the one module instance in response to a third user command; and
    displaying results of both the simulation and emulation of the one module instance simultaneously in response to a fourth user command.

3. The method of claim 2, wherein the simulation results displayed are changeable in response to a user command during simulation.

4. The method of claim 1, wherein:
    the simulation and emulation of the respective simulation and emulation models are performed using a first set of input data; and
    the method further comprises, following emulation of each module instance on the programmable logic circuitry using the first set of input data, bypassing further configuration of the programmable logic circuitry and emulating each module instance on the programmable logic circuitry using a second set of input data as simulation input.

5. The method of claim 1, wherein selecting one or more module instances to be both simulated and emulated bypasses the use of a hardware description language editor.

6. The method of claim 5, wherein selecting one or more module instances to be both simulated and emulated comprises:
prompting the user to select module instances to be co-simulated;
detecting user selections; and
storing data indicating module instances to be co-simulated.

7. The method of claim 6, wherein selecting one or more module instances to be both simulated and emulated further comprises displaying a hierarchical representation of the plurality of module instances.

8. The method of claim 1, wherein the simulation environment is configured for communication with the respective emulation model during simulation and emulation by means of a JTAG port on the programmable logic circuitry.

9. The method of claim 1, further comprising:
in response to the discrepancy, performing the steps of:
pausing the simulation;
displaying stored discrepancy data; and
resuming the simulation in response to a fifth user command.

10. The method of claim 1, further comprising:
displaying results of the simulation of one module instance of the one or more module instances, in response to a second user command;
displaying results of the emulation of the one module instance, in response to a third user command;
displaying results of both the simulation and emulation of the one module instance in response to a fourth user command; and
in response to a fifth user command, displaying results of both the simulation and emulation and highlighting differences between the simulation and emulation results.

11. A system for co-simulation of a portion of a circuit design, comprising:
programmable logic circuitry; and
a computing arrangement including a processor and memory coupled to the programmable logic circuitry;
wherein the computing arrangement is configured to:
compile each of one or more module instances of a plurality of module instances of a high level modeling system circuit design into both a respective simulation model and a respective emulation model;
identify a port name, direction, and type of each input and output port of each of the one or more module instances;
generate for each of the one or more module instances, in response to the identified port name, direction, and type of each input and output port, a memory map for accessing the respective emulation model;
configure the programmable logic circuitry to operate in accordance with each emulation model;
send and receive emulation data to and from the programmable logic circuitry during operation of the programmable logic circuitry;
for each module instance of the one or more module instances, concurrently simulate the module instance on the computing arrangement using the respective simulation model and emulate the module instance on the programmable logic circuitry using the respective emulation model;
compare results from the simulation of the simulation model with results of emulation of the emulation model;
in response to a discrepancy between the compared results, store discrepancy data indicating a time and module instance in which the discrepancy occurred; and
output results from the simulation and emulation of the respective simulation and emulation models.

12. The system of claim 11, wherein the computing arrangement is further configured to:
transform the high level modeling system circuit design into a hierarchical representation of the plurality of module instances;
display the hierarchical representation to a user; and
allow the user to select module instances to be emulated on the programmable logic circuitry.

13. The system of claim 11, wherein the computing arrangement is further configured to, in response to a discrepancy between the output of the simulation and emulation of the respective simulation and emulation models, store data indicating a time and module instance in which the discrepancy occurred.

14. The system of claim 11, wherein:
the programmable logic circuitry includes a JTAG port system; and
the computing arrangement is further configured to send and receive data to and from the programmable logic circuitry through the JTAG port.

15. An article of manufacture, comprising:
an electronically readable non-transitory storage medium storing instructions that, when loaded into a processor, cause the processor to:
select one or more module instances from a plurality of module instances of a high level modeling system circuit design to be both simulated within a software simulation environment and emulated on programmable logic circuitry;
compile each of the one or more module instances into both a respective simulation model and a respective emulation model in response to a first user command;
identify a port name, direction, and type of each input and output port of each of the one or more module instances;
generate for each of the one or more module instances, in response to the identified port name, direction, and type of each input and output port, a memory map for accessing the respective emulation model;
configure the programmable logic circuitry using each respective emulation model;
configure the simulation environment to communicate with each respective emulation model during simulation and emulation;
for each module instance of the one or more module instances, concurrently simulate and emulate the respective simulation model and emulation model of the module instance;
compare results from the simulation of the simulation model with results of emulation of the emulation model;
in response to a discrepancy between the compared results, store discrepancy data indicating a time and module instance in which the discrepancy occurred; and output results from the simulation and emulation of each respective simulation model and each respective emulation model.

16. The article of manufacture of claim 15, wherein the electronically readable storage medium further stores instructions causing the processor to:

display results of the simulation of one module instance of the one or more module instances in response to a second user command;

display results of the emulation of the one module instance in response to a third user command; and display results of both the simulation and emulation of the one module instance in response to a fourth user command.

17. The article of manufacture of claim 16, wherein the simulation results displayed are changeable in response to a user command during simulation.

18. The article of manufacture of claim 15, wherein the electronically readable storage medium further stores instructions causing the processor to:

simulate and emulate the respective simulation and emulation models using a first set of input data;

following emulation of each module instance on the programmable logic circuitry using the first set of input data, bypass further configuration of the programmable logic circuitry; and emulate each module instance on the programmable logic circuitry using a second set of input data as simulation input.

* * * * *